United States Patent
Ogawa

(10) Patent No.: US 7,377,775 B2
(45) Date of Patent: May 27, 2008

(54) HEATING APPARATUS

(75) Inventor: Hideki Ogawa, Hino (JP)

(73) Assignee: Kabushiki Kaisha Toshiba (JP)

( * ) Notice: Subject to any disclaimer, the term of this patent is extended or adjusted under 35 U.S.C. 154(b) by 183 days.

(21) Appl. No.: 11/444,118

(22) Filed: May 31, 2006

(65) Prior Publication Data

US 2006/0269888 A1 Nov. 30, 2006

(30) Foreign Application Priority Data

May 31, 2005 (JP) .............................. 2005-160612

(51) Int. Cl.
*F27B 9/02* (2006.01)
(52) U.S. Cl. .............................. 432/128; 432/2; 432/74
(58) Field of Classification Search ................ 432/128, 432/2, 74, 121, 129, 132; 34/85; 431/119
See application file for complete search history.

(56) References Cited

U.S. PATENT DOCUMENTS

| | | | | |
|---|---|---|---|---|
| 3,985,637 | A * | 10/1976 | Storrs | 208/402 |
| 4,375,957 | A * | 3/1983 | Smith | 432/2 |
| 6,694,637 | B2 * | 2/2004 | Miller et al. | 34/82 |
| 6,780,225 | B2 * | 8/2004 | Shaw et al. | 95/273 |
| 2007/0042313 | A1 * | 2/2007 | Shibamura et al. | 432/121 |
| 2007/0057020 | A1 * | 3/2007 | Shibamura et al. | 228/101 |

FOREIGN PATENT DOCUMENTS

| | | |
|---|---|---|
| JP | 8-008528 | 1/1996 |
| JP | 08-274459 | 10/1996 |
| JP | 10-027955 | 1/1998 |

* cited by examiner

*Primary Examiner*—Gregory A. Wilson
(74) *Attorney, Agent, or Firm*—Knobbe Martens Olson & Bear, LLP

(57) ABSTRACT

According to one embodiment, a heating apparatus includes, a heating chamber, a fan provided in the heating chamber, the fan blowing atmosphere upward, a heater provided in the heating chamber and above the fan, the heater heating the atmosphere blown by the fan, a plurality of first straightening vanes arranged in a substantially horizontal direction so as to be spaced apart from one another in the heating chamber and above the heater, a plurality of second straightening vanes arranged in a substantially horizontal direction so as to be spaced apart from one another in the heating chamber and above the first straightening vanes, each of the plurality of second straightening vanes overlapping both of its adjacent first straightening vanes, and a transfer unit which transfers a board, at least part of the transfer unit being provided in the heating chamber and located above the second straightening vanes.

8 Claims, 5 Drawing Sheets

HEATING APPARATUS

CROSS-REFERENCE TO RELATED APPLICATIONS

This application is based upon and claims the benefit of priority from Japanese Patent Application No. 2005-160612, filed May 31, 2005, the entire contents of which are incorporated herein by reference.

BACKGROUND

1. Field

The present invention relates to a heating apparatus for use in mounting an electronic component on a printed board.

2. Description of the Related Art

In order to mount an electronic component with leads on a printed board, through holes are provided in the printed board. The leads of the electronic component are inserted into the through holes, and then, soldering is performed. The soldering has been performed manually or the like without using a reflow apparatus.

However, for the purpose of increasing production efficiency, it is desirable to solder an electronic component with leads by using a reflow apparatus. However, if an electronic component with leads is soldered by using a reflow apparatus, the viscosity of a solder paste applied onto a printed board decreases before the leads of the electronic component are inserted into through holes, and as a result, the solder paste drops down through the through holes.

The solder paste having dropped down contaminates a heater of the reflow apparatus, thereby decreasing heating efficiency. Due to a decrease in heating efficiency, soldering defects may occur. The occurrence of soldering defects may reduce production efficiency.

There is disclosed a technique in which a silica glass substrate is provided between an infrared heater and a printed board to prevent the heater from being contaminated by soldering (Jpn. Pat. Appln. KOKAI Publication No. 10-27955).

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a heating apparatus includes, a heating chamber, a fan provided in the heating chamber, the fan blowing atmosphere upward, a heater provided in the heating chamber and above the fan, the heater heating the atmosphere blown by the fan, a plurality of first straightening vanes arranged in a substantially horizontal direction so as to be spaced apart from one another in the heating chamber and above the heater, a plurality of second straightening vanes arranged in a substantially horizontal direction so as to be spaced apart from one another in the heating chamber and above the first straightening vanes, each of said plurality of second straightening vanes overlapping both of its adjacent first straightening vanes, and a transfer unit which transfers a board, at least part of the transfer unit being provided in the heating chamber and located above the second straightening vanes.

FIRST EMBODIMENT

Figure 1:
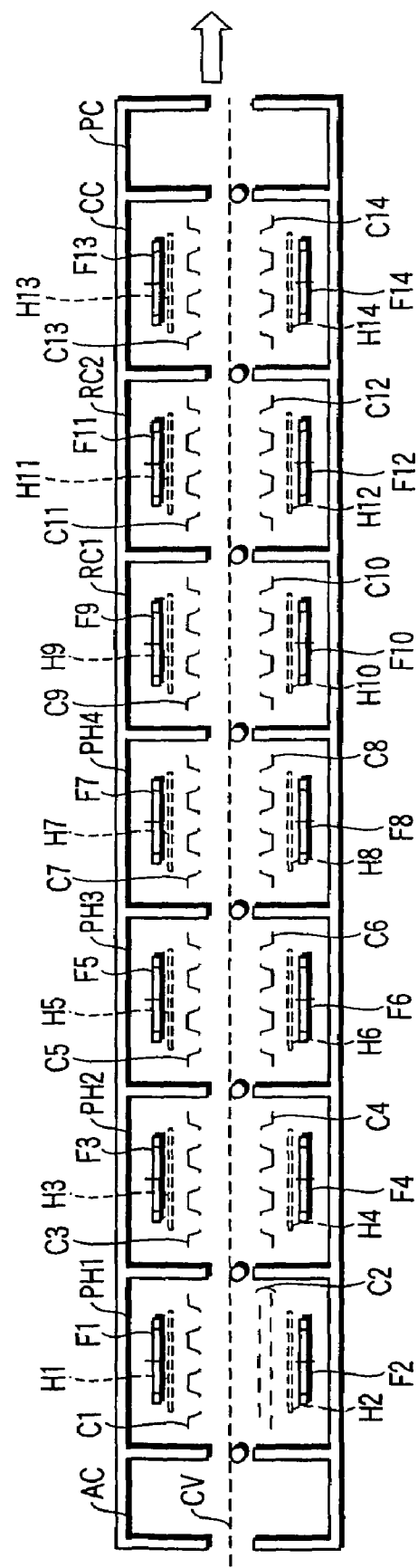
FIG. 1 is an exemplary diagram showing a configuration of a heating furnace according to a first embodiment.

FIG. 1 is a diagram showing a schematic configuration of a heating furnace for use in soldering an electronic component onto a printed wiring board according to a first embodiment of the present invention.

The heating furnace has an anterior chamber AC, a first preheating chamber PH1, a second preheating chamber PH2, a third preheating chamber PH3, a fourth preheating chamber PH4, a first reflow chamber RC1, a second reflow chamber RC2, a cooling chamber CC, and a posterior chamber PC.

By means of a transfer conveyor CV provided to pass through the heating furnace, a printed wiring board is allowed to sequentially pass through the anterior chamber AC, the first preheating chamber PH1, the second preheating chamber PH2, the third preheating chamber PH3, the fourth preheating chamber PH4, the first reflow chamber RC1, the second reflow chamber RC2, the cooling chamber CC, and the posterior chamber PC.

The first to fourth preheating chambers PH1 to PH4, the first and second reflow chambers RC1 and RC2, and the cooling chamber CC respectively have, above and below the transfer conveyor CV, fans F1 to F14, heaters H1 to H14 for heating atmosphere blown by the fans F1 to F14, and straightening units C1 to C14 for blowing the atmosphere onto the printed board.

The temperature of the printed wiring board is set to increase by the printed wiring board moving from the first preheating chamber PH1 to the fourth preheating chamber PH4. In addition, the temperatures inside of the chambers are set appropriately such that soldering is performed when the printed wiring board passes through the first reflow chamber RC1 and the second reflow chamber RC2.

According to an experiment conducted by the inventor, it has been found that a solder paste drops through holes only in the first preheating chamber PH1 and a solder paste does not drop in any subsequent chambers.

In view of this, the heating furnace of the present embodiment is configured such that even if a solder paste drops in the first preheating chamber, the temperature change is suppressed.

Figure 2:
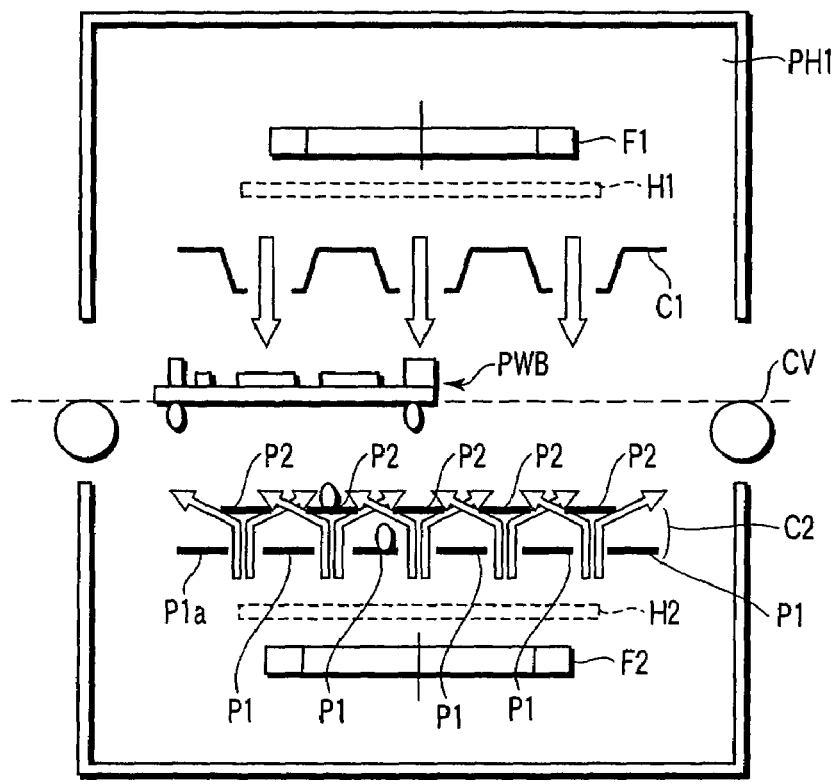
FIG. 2 is an exemplary diagram showing a configuration of a first preheating chamber of the heating furnace shown in FIG. 1.

FIG. 2 is a cross-sectional view showing a configuration of the first preheating chamber of the heating furnace according to the first embodiment of the invention.

Although an upper mechanism where hot air is blown from above onto a printed board is the same as conventional ones, a change is made to a lower mechanism where the dropping of a solder paste takes place.

The fan F2 for blowing atmosphere upward is provided. The heater H2 for heating the atmosphere blown by the fan F2 is provided above the fan F2. The straightening unit C2 is provided above the heater H2. The straightening unit C2 has first straightening vanes P1 and second straightening vanes P2 provided above the first straightening vanes P1. The straightening unit C2 is insertable into and removable from the first preheating chamber PH1.

The first straightening vanes P1 are arranged in a substantially horizontal direction so as to be spaced apart from one another. A first slit is provided between adjacent first straightening vanes P1. The second straightening vanes P2 are arranged in a substantially horizontal direction so as to be spaced apart from one another. A second slit is provided between adjacent second straightening vanes P2.

Figure 3:
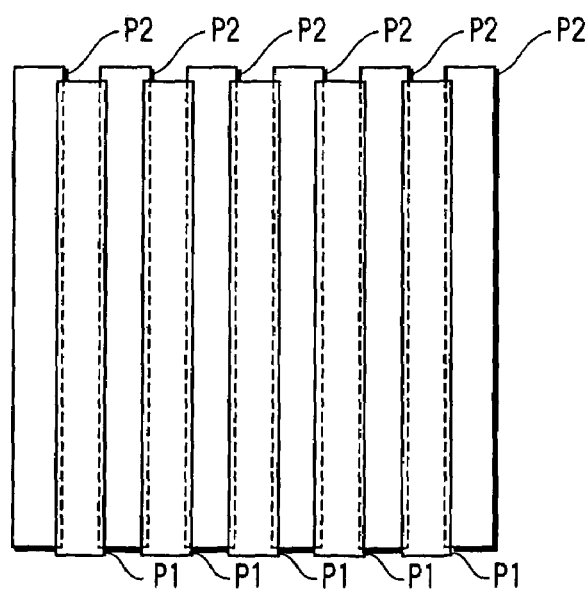
FIG. 3 is an exemplary diagram showing an arrangement of first straightening vanes and second straightening vanes in the first preheating chamber.

As shown in FIG. 3, the width of each second straightening vane P2 is adjusted such that the second straightening vane P2 overlaps both of a pair of its adjacent first straightening vanes P1 provided below the second straightening vane P2. In other words, the first slits among the first straightening vanes P1 and the second slits among the second straightening vanes P2 are provided so as not to overlap one another. Since the positions of the first slits and the positions of the second slits do not overlap one another, a solder paste having dropped from the printed wiring board PWB is received by the first straightening vane P1 or second straightening vane P2. Accordingly, a solder paste does not adhere to either the fan F2 or the heater H2. The solder paste having dropped onto the first straightening vane P1 or the second straightening vane P2 does not inhibit the flow of hot air blown by the fan F2 and the heater H2. Therefore, even if a solder paste drops from the print wiring board PWB, the reflow efficiency is hardly reduced, making it possible to suppress a reduction in production efficiency.

As described above, by employing a hot air type heating furnace and changing the configuration of the straightening unit, it is possible to suppress a reduction in production efficiency caused by a reduction in reflow efficiency due to a solder paste dropping from a printed wiring board PWB which occurs when an infrared type heating furnace is employed.

SECOND EMBODIMENT

In the case of the configuration of the first embodiment, a solder paste having dropped onto a first straightening vane and a second straightening vane may be moved by hot air and drop onto the heater H2 and the fan F2. In the present embodiment, a configuration in which the configuration of the straightening unit C2 is modified to surely inhibit a solder paste from dropping onto the heater H2 and the fan F2 will be described with reference to FIG. 4.

Figure 4:
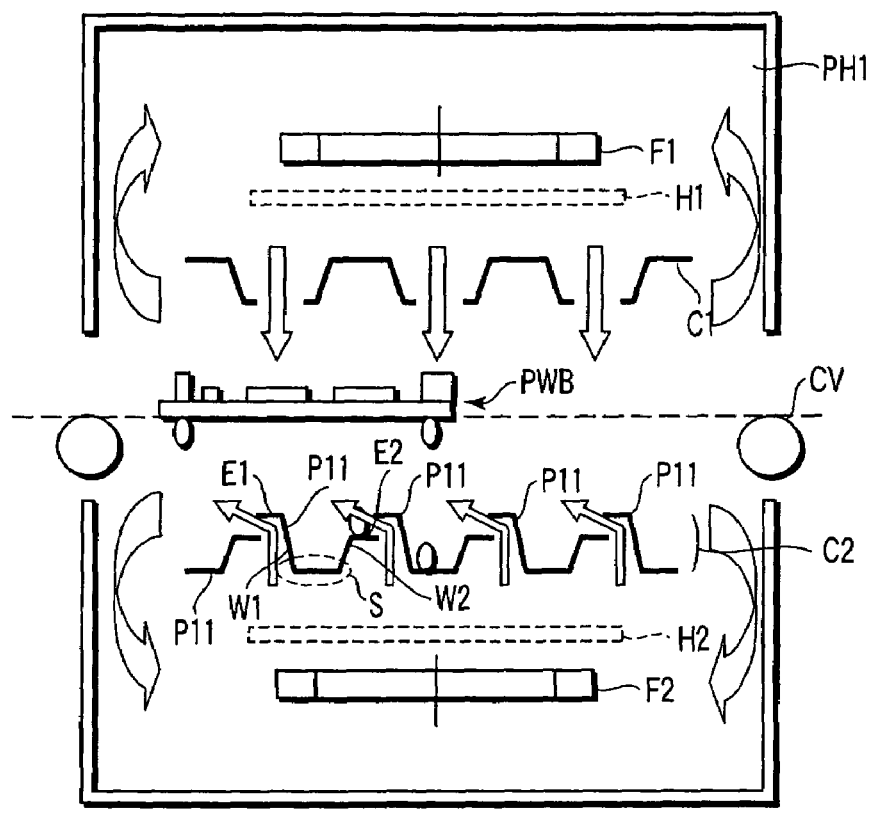
FIG. 4 is an exemplary diagram showing a configuration of a first preheating chamber of a heating furnace according to a second embodiment.

FIG. 4 is a cross-sectional view showing a configuration of a first preheating chamber of a heating furnace according to a second embodiment of the present invention. The configuration of the first preheating chamber is the same as that in the first embodiment except for the configuration of a straightening unit C2, and therefore, the configuration of the straightening unit C2 will be described.

The straightening unit C2 is composed of a plurality of straightening vanes P11 arranged substantially horizontally. The straightening unit C2 is insertable into and removable from a first preheating chamber PH1.

Figure 5:
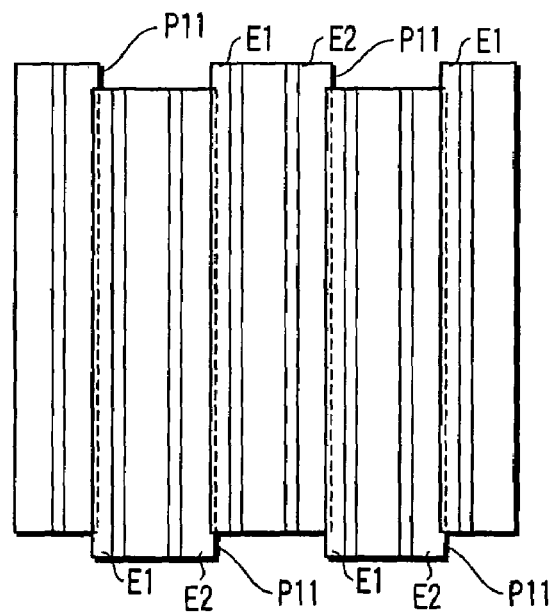
FIG. 5 is an exemplary diagram showing an arrangement of straightening vanes in the first preheating chamber according to the second embodiment.

Each straightening vane P11 has a tray unit S sandwiched between a first wall W1 and a second wall W2 whose upper portion is lower than an upper portion of the first wall W1. A first canopy unit E1 is provided to the upper portion of the first wall W1. A second canopy unit E2 is provided to the upper portion of the second wall W2. As shown in FIG. 5, the first canopy unit E1 overlaps the second canopy unit E2 of its adjacent straightening vane P11.

In the present embodiment, a solder paste having dropped onto a straightening vane P11 from a printed wiring board PWB is accumulated on a tray unit S sandwiched between a pair of walls W. The solder paste having been accumulated on the tray unit S does not fall on either a heater H2 or a fan F2 unless the solder paste overflows the tray unit S.

Thus, even if a solder paste drops from the printed wiring board PWB, the reflow efficiency is hardly reduced, making it possible to suppress a reduction in production efficiency.

The tray unit S of the present embodiment has a flat portion in a region sandwiched between a pair of walls. However, such a flat portion does not need to be provided and a V-shaped tray unit sandwiched between a pair of walls may be used.

Note that although the second canopy unit E2 provided to a wall W having a low upper portion is present, the second canopy unit E2 does not need to be provided if the dropping of a solder paste does not occur without the second canopy Unit E2.

THIRD EMBODIMENT

Figure 6:
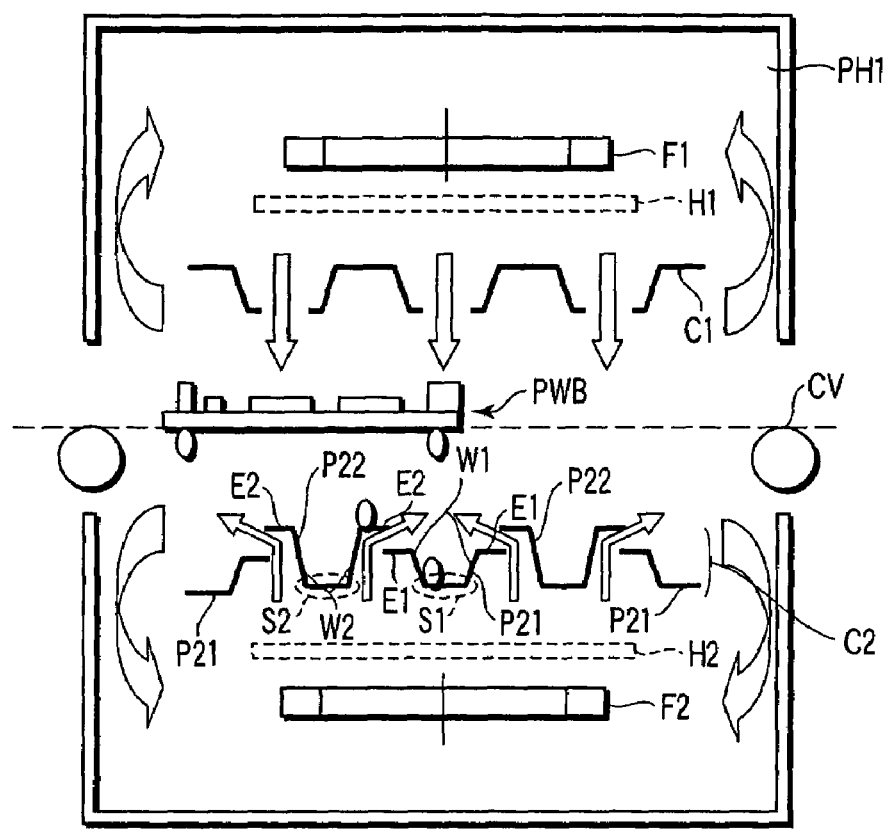
FIG. 6 is an exemplary diagram showing a configuration of a first preheating chamber of a heating furnace according to a third embodiment.

With reference to FIG. 6, a configuration of a straightening unit C2 will be described which inhibits a solder paste from dropping from the straightening unit C2 and which takes into account the flow of hot air.

FIG. 6 is a cross-sectional view showing a configuration of a first preheating chamber of a heating furnace according to a third embodiment of the present invention. The configuration of the first preheating chamber is the same as that in the first embodiment except for the configuration of the straightening unit C2, and therefore, the configuration of the straightening unit C2 will be described.

The straightening unit C2 has a plurality of first straightening vanes P21 arranged substantially horizontally and a plurality of second straightening vanes P22 arranged substantially horizontally. The straightening unit C2 is insertable into and removable from a first preheating chamber PH1.

Each first straightening vane P21 has a first tray unit S1 sandwiched between a pair of walls W1. First canopy units E1 are provided to upper portions of the pair of walls W1, respectively. Each second straightening vane P22 has a second tray unit S2 sandwiched between a pair of walls W2. Second canopy units E2 are provided to upper portions of the pair of walls W2, respectively.

Figure 7:
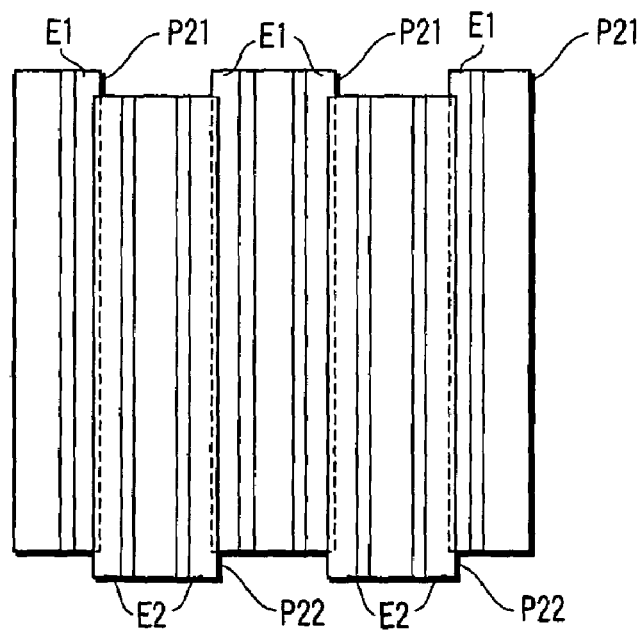
FIG. 7 is an exemplary diagram showing an arrangement of straightening vanes in the first preheating chamber according to the third embodiment.

As shown in FIG. 7, the first canopy unit E1 and the second canopy unit E2 overlap each other.

In the case of the present embodiment, a solder paste having dropped onto the straightening vane P21 from a printed wiring board PWB is accumulated on the first tray unit S1 sandwiched between the pair of walls W1 and the second tray unit S2 sandwiched between the pair of walls W2. The solder paste having been accumulated on the first tray unit S1 and the second tray unit S2 does not fall on either a heater H2 or a fan F2 unless the solder paste overflows the first tray unit S1 and the second tray unit S2.

In addition, in the case of the present embodiment, the orientation of hot air blown out of the straightening unit C2 is alternately reversed. By thus straightening hot air, hot air present below the printed wiring board PWB is stirred, making it possible to minimize temperature variation.

The first tray unit S1 and the second tray unit S2 of the present embodiment each have a flat portion in a region sandwiched between a pair of walls. However, such a flat portion does not need to be provided and a V-shaped tray unit sandwiched between a pair of walls may be used.

The second straightening vanes P22 each have the second tray unit S2. However, even if a solder paste spills from the second straightening vane P22, the solder paste is caught onto the first straightening vane P21, and thus, the solder paste does not drop onto either the heater H2 or fan F2. Hence, the second straightening vanes P22 may be structured without the second tray units S2; for example, the second straightening vanes P22 may be formed in a flat plate shape.

FOURTH EMBODIMENT

In the present embodiment, a configuration of a heating furnace will be described in which a configuration of a straightening unit C2 is the same as that of conventional ones and the arrangement of heaters and fans is changed to prevent a solder paste having dropped from a printed wiring board PWB from falling on the heaters and the fans.

Figure 8:
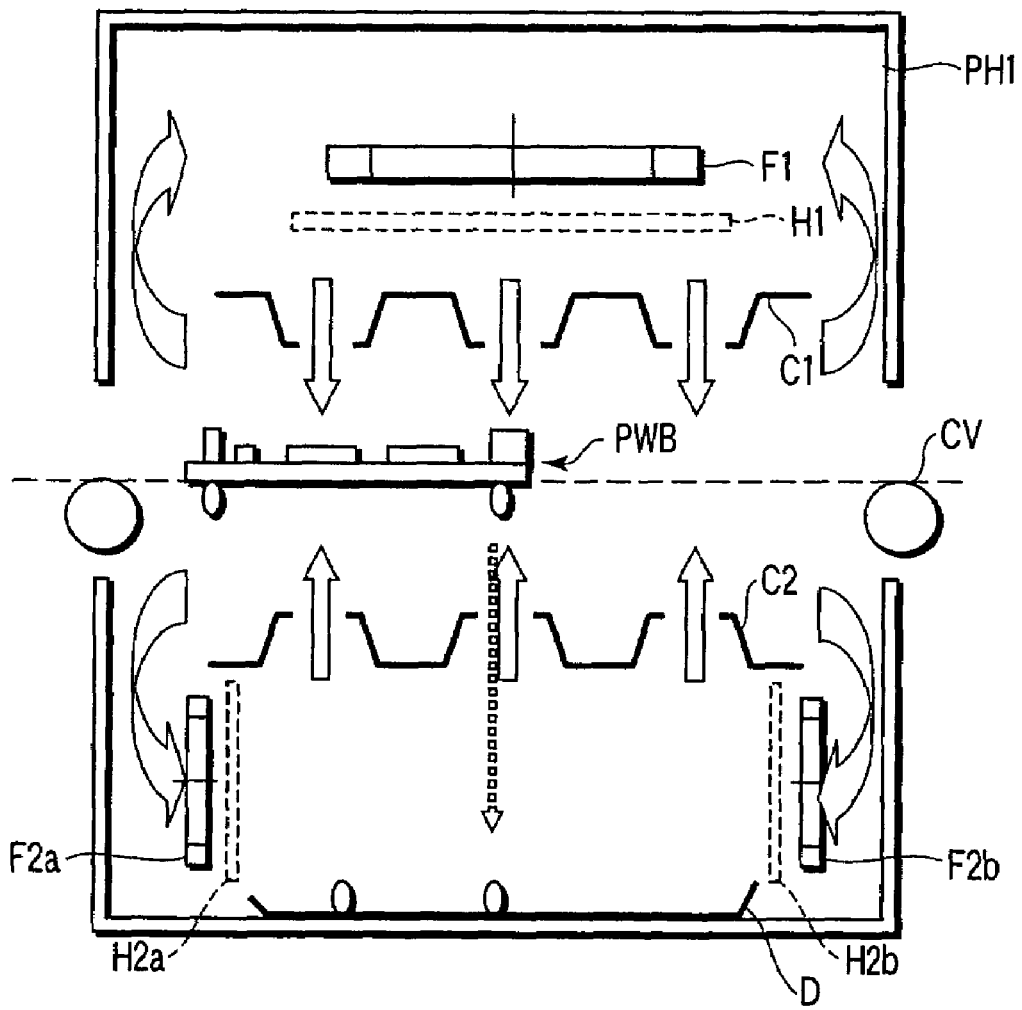
FIG. 8 is an exemplary diagram showing a configuration of a first preheating chamber of a heating furnace according to a fourth embodiment.

FIG. 8 is a cross-sectional view showing a configuration of a first preheating chamber of a heating furnace according to a fourth embodiment of the present embodiment.

As shown in FIG. 8, the configuration of a straightening unit C2 below a conveyor CV is the same as that of a straightening unit C1 above the conveyor CV.

A pair of fans F2a and F2b is provided so as to sandwich the straightening unit C2. The fan F2a blows air toward the fan F2b. Similarly, the fan F2b blows air toward the fan F2a. A heater H2a is provided on a side toward which air is blown by the fan F2a, and hot air is produced. Similarly, a heater H2b is provided on a side toward which air is blown by the fan F2b, and hot air is produced. That is, the heaters H2a and H2b and the fans F2a and F2b are not provided beneath the straightening unit C2.

A tray S is provided beneath the straightening unit C2. The tray S is provided in a lower position than the fans F2a and F2b and the heaters H2a and H2b. The tray S can be taken out of a side portion of the heating furnace and replaced.

The fans F2a and F2b respectively blow air toward the fans F2a and F2b located on the opposite side thereof. That is, the fans F2a and F2b blow air toward a midpoint between the fans F2a and F2b. Since the fans F2a and F2b blow air toward the same point, an air current of hot air directed toward above (straightening unit C2) is generated. By the hot air directed toward above, a printed wiring board PWB is heated.

Even if a printed wiring board PWB is heated and a solder paste drops from the printed wiring board PWB, the solder paste does not fall on the heater H2a or H2b or the fan F2a or F2b since the heaters H2a and H2b and the fans F2a and F2b are not provided beneath the straightening unit C2.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A heating apparatus comprising:
   a heating chamber;
   a fan provided in the heating chamber, the fan blowing atmosphere upward;
   a heater provided in the heating chamber and above the fan, the heater heating the atmosphere blown by the fan;
   a plurality of first straightening vanes arranged in a substantially horizontal direction so as to be spaced apart from one another in the heating chamber and above the heater;
   a plurality of second straightening vanes arranged in a substantially horizontal direction so as to be spaced apart from one another in the heating chamber and above the first straightening vanes, each of said plurality of second straightening vanes overlapping both of its adjacent first straightening vanes; and
   a transfer unit which transfers a board, at least part of the transfer unit being provided in the heating chamber and located above the second straightening vanes.

2. The heating apparatus according to claim 1, further comprising a straightening unit having the first straightening vanes and the second straightening vanes, wherein the straightening unit is insertable into and removable from the heating chamber.

3. A heating apparatus comprising:
   a heating chamber;
   a fan provided in the heating chamber, the fan blowing a gas upward;
   a heater provided in the heating chamber and above the fan, the heater heating the gas blown by the fan;
   a plurality of straightening vanes arranged in a substantially horizontal direction so as to be spaced apart from one another in the heating chamber and above the heater, each of said plurality of straightening vanes having: a tray unit sandwiched between a first wall and a second wall whose upper portion is lower in height than an upper portion of the first wall; and a canopy unit provided to the upper portion of the first wall, the canopy unit overlapping part of its adjacent straightening vanes; and
   a transfer unit which transfers a board, at least part of the transfer unit being provided in the heating chamber and located above the straightening vanes.

4. The heating apparatus according to claim 3, further comprising a straightening unit having said plurality of straightening vanes, wherein the straightening unit is insertable into and removable from the heating chamber.

5. The heating apparatus according to claim 3, wherein each of the straightening vanes further has a second canopy unit provided to an upper portion of its second wall.

6. A heating apparatus comprising:
   a heating chamber;
   a fan provided in the heating chamber, the fan blowing a gas upward;

a heater provided in the heating chamber and above the fan, the heater heating the gas blown by the fan;

a plurality of first straightening vanes arranged in a substantially horizontal direction so as to be spaced apart from one another in the heating chamber and above the heater, each of the first straightening vanes having: a tray unit sandwiched between a pair of walls; and a pair of canopy units provided to upper portions of the pair of walls, respectively;

a plurality of second straightening vanes arranged in a substantially horizontal direction so as to be spaced apart from one another in the heating chamber and above the first straightening vanes, each of the second straightening vanes overlapping both of its adjacent first straightening vanes; and a transfer unit which transfers a board, at least part of the transfer unit being provided in the heating chamber and located above the second straightening vanes.

7. The heating apparatus according to claim 6, wherein each of the second straightening vanes has: a second tray unit sandwiched between a pair of second walls; and a pair of second canopy units provided to upper portions of the pair of second walls, respectively.

8. The heating apparatus according to claim 6, further comprising a straightening unit having the first straightening vanes and the second straightening vanes, wherein the straightening unit is insertable into and removable from the heating chamber.

* * * * *